(12) United States Patent
Li

(10) Patent No.: US 11,784,191 B2
(45) Date of Patent: Oct. 10, 2023

(54) ARRAY SUBSTRATE, MANUFACTURING METHOD THEREOF, AND DISPLAY DEVICE

(71) Applicant: TCL CHINA STAR OPTOELECTRONICS TECHNOLOGY CO., LTD., Shenzhen (CN)

(72) Inventor: Jinming Li, Shenzhen (CN)

(*) Notice: Subject to any disclaimer, the term of this patent is extended or adjusted under 35 U.S.C. 154(b) by 424 days.

(21) Appl. No.: 17/045,187

(22) PCT Filed: Aug. 12, 2020

(86) PCT No.: PCT/CN2020/108585
§ 371 (c)(1),
(2) Date: Oct. 5, 2020

(87) PCT Pub. No.: WO2021/248676
PCT Pub. Date: Dec. 16, 2021

(65) Prior Publication Data
US 2023/0120164 A1  Apr. 20, 2023

(30) Foreign Application Priority Data
Jun. 8, 2020 (CN) .......................... 202010511787.3

(51) Int. Cl.
*H01L 27/00* (2006.01)
*H01L 27/12* (2006.01)
*H01L 29/786* (2006.01)

(52) U.S. Cl.
CPC ...... *H01L 27/1237* (2013.01); *H01L 27/1274* (2013.01); *H01L 27/1225* (2013.01); *H01L 29/7869* (2013.01)

(58) Field of Classification Search
CPC ............. H01L 27/1237; H01L 27/1274; H01L 27/1225; H01L 27/12; H01L 27/1222; H01L 27/1259; H01L 29/7869; H01L 29/786; H01L 29/458; H01L 29/66969
See application file for complete search history.

(56) References Cited

U.S. PATENT DOCUMENTS

| 9,147,719 | B2* | 9/2015 | Kim .................... H01L 27/1251 |
| 9,548,324 | B2* | 1/2017 | Li ........................ H01L 21/0274 |
| 2014/0231813 | A1 | 8/2014 | Oda et al. |
| 2015/0123084 | A1* | 5/2015 | Kim .................... H01L 27/1251 |
| | | | 257/43 |

(Continued)

FOREIGN PATENT DOCUMENTS

| CN | 104022079 A | 9/2014 |
| CN | 104183608 A | 12/2014 |
| CN | 104952884 A | 9/2015 |

(Continued)

*Primary Examiner* — Nikolay K Yushin

(57) ABSTRACT

The present disclosure provides an array substrate, a manufacturing method thereof, and a display device. The array substrate includes a substrate, at least one first thin film transistor, and at least one second thin film transistor. A second etching barrier block is disposed between an active layer and a first source electrode, and the first drain electrode is close to the active layer, thereby shortening an effective channel of the first thin film transistor, so that a mobility of transistors and a number of pixels of a panel can be improved.

18 Claims, 12 Drawing Sheets

(56) References Cited

U.S. PATENT DOCUMENTS

2016/0027819 A1* 1/2016 Li ...................... H01L 27/1244
438/151

FOREIGN PATENT DOCUMENTS

| CN | 106057735 A | 10/2016 |
| CN | 107302030 A | 10/2017 |
| CN | 110739271 A | 1/2020 |

* cited by examiner

ARRAY SUBSTRATE, MANUFACTURING METHOD THEREOF, AND DISPLAY DEVICE

FIELD OF INVENTION

The present disclosure relates to the field of display technologies, and particularly relates to an array substrate, a manufacturing method thereof, and a display device.

BACKGROUND OF INVENTION

Generally, a polysilicon active layer of thin film transistors has higher mobility, which makes a leakage current (Ioff) of low temperature polysilicon (LTPS) thin film transistors higher. Because a power consumption of LTPS substrates under low frequency driving is large, it is difficult to maintain static black images well, and image quality is poor. And in order to better distribute gray scales, in the LTPS substrates, channels of driving thin film transistors (DTFT) need to be made very long, which makes it difficult to achieve a high resolution (resolution refers to a number of pixels per inch (PPI)) of the LTPS substrates.

Technical Problems

Additionally, the polysilicon active layers have large hysteresis, so a problem of afterimages may easily occur in the LTPS substrates.

Due to a lower mobility of active layers of oxide materials, a leakage current of oxide thin film transistors is low, a power consumption of oxide substrates under the low frequency driving is low, and the oxide substrates can maintain static black images to improve image quality. And gray scales can be better distributed in the oxide substrates without making the channels of the DTFTs very long, and high PPI can be achieved.

In addition, the oxide active layers have a low hysteresis, so the oxide substrates are not prone to the problem of afterimages. Therefore, a uniformity of oxide thin film transistors is better than a uniformity of LTPS thin film transistors.

Therefore, it is necessary to provide an array substrate, which can use metal oxide thin film transistors as switching thin film transistors and use LTPS as driving thin film transistors to simultaneously solve problems that the resolution of the LTPS substrates is low and the mobility of transistors is low.

Technical Solutions

An array substrate and a manufacturing method thereof are provided. The array substrate mixed with oxide thin film transistors and LTPS thin film transistors is prepared to be able to improve a mobility of transistors and the number of pixels of panels.

To achieve the above purposes, an array substrate is provided. The array substrate includes a substrate and at least one first thin film transistor and at least one second thin film transistor disposed in parallel on the substrate. The first thin film transistor is an oxide thin film transistor and the second thin film transistor is a low temperature polysilicon (LTPS) thin film transistor. Wherein the first thin film transistor includes a first gate electrode disposed on the substrate, a gate insulating layer disposed on the first gate electrode and the substrate, an active layer disposed on the gate insulating layer, a first drain electrode disposed on the gate insulating layer, a first etching barrier block disposed on the gate insulating layer, and a first source electrode disposed on the active layer, wherein the first drain electrode and the active layer are prepared in a same layer, and the first etching barrier block is located between the second thin film transistor and the first drain electrode.

Further, the first thin film transistor further includes a second etching barrier block disposed between the active layer and the first source electrode.

Furthermore, the second etching barrier block and the first etching barrier block are prepared in a same layer.

Furthermore, materials of the active layer and materials of the first drain electrode are indium gallium zinc oxides.

Furthermore, the second thin film transistor includes a second gate electrode disposed on the substrate and coated by the gate insulating layer, a polysilicon layer disposed on the gate insulating layer, a second source electrode disposed on the first etching barrier block and the polysilicon layer, and a second drain electrode disposed on the polysilicon layer, wherein the second gate electrode and the first gate electrode are prepared in a same layer.

Furthermore, the second source electrode, the second drain electrode, and the first source electrode are prepared in a same layer.

Furthermore, an opening is defined in the gate insulating layer and extends downwards to a surface of the second gate electrode, and the active layer is connected to the second gate electrode through the opening.

Furthermore, a passivation layer is disposed on the first thin film transistor and the second thin film transistor, and a first electrode is disposed on the passivation layer and connected to the second thin film transistor.

Another purpose of the present disclosure is to provide a manufacturing method of an array substrate, the manufacturing method includes: providing a substrate; forming a first gate electrode and a second gate electrode on the substrate; forming a gate insulating layer on the first gate electrode, the second gate electrode and the substrate; forming an active layer, a first drain electrode and a polysilicon layer on the gate insulating layer; forming a first etching barrier block on the gate insulating layer and forming a second etching barrier block on the active layer, wherein the first etching barrier block is disposed between the polysilicon layer and the first drain electrode; and forming a first source electrode on the active layer, forming a second source electrode on the first etching barrier block and the polysilicon layer, and forming a second drain electrode on the polysilicon layer.

Furthermore, a step of forming the active layer, the first drain electrode and the polysilicon layer on the gate insulating layer specifically includes: forming a semiconductor layer on the gate insulating layer; after forming a first single crystalline silicon layer on the semiconductor layer, forming the active layer and the first drain electrode by the semiconductor layer, forming a second single crystalline silicon layer on the gate insulating layer, and forming an inducing layer on the second single crystalline silicon layer; processing the active layer and the second single crystalline silicon layer by a high temperature annealing process, so as to form the polysilicon layer by the second single crystalline silicon layer; and removing the inducing layer and the first single crystalline silicon layer.

Beneficial Effects

An array substrate, a manufacturing method thereof, and a display device are provided by the present disclosure. The first thin film transistor and the second thin film transistor are defined by the first etching barrier block. Additionally, the second etching barrier block is disposed between the active layer and the first source electrode, and the first drain electrode is close to the active layer, so an effective channel of the first thin film transistor can be shortened, thereby greatly improving a mobility of transistors and the number of pixels of a panel.

Figure 1:
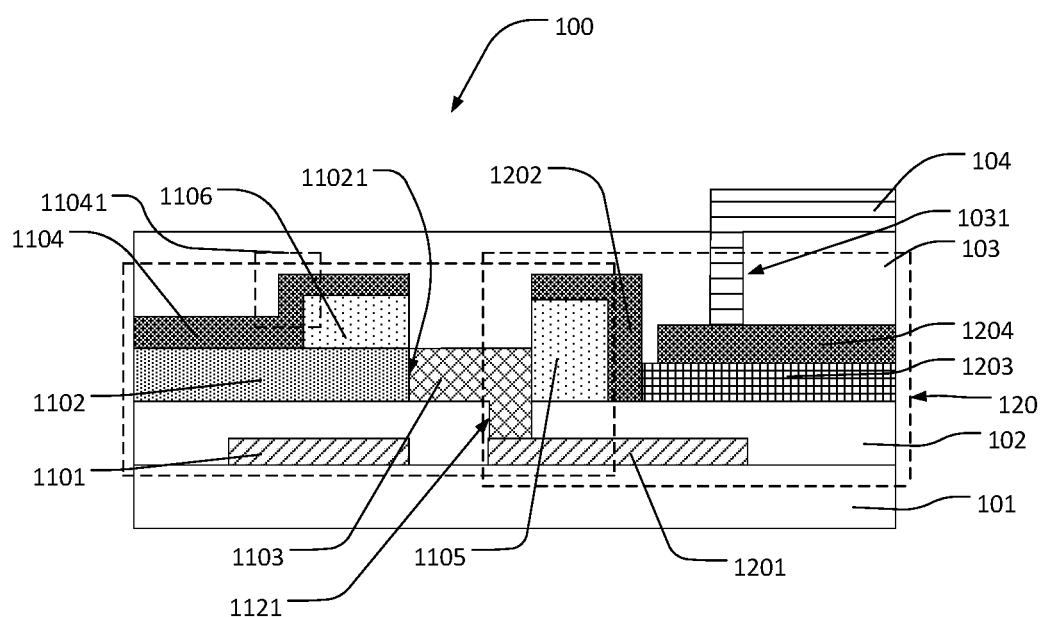
FIG. 1 is a schematic view of an array substrate provided by the present disclosure.

Array substrate 100; substrate 101; first thin film transistor 110; second thin film transistor 120; first gate electrode 1101; gate insulating layer 102; active layer 1102; first drain electrode 1103; first source electrode 1104; first etching barrier block 1105; second etching barrier block 1106; second gate electrode 1201; polysilicon layer 1203; second source electrode 1202; second drain electrode 1204; passivation layer 103; first electrode 104; opening 1121; groove 1031.

DETAILED DESCRIPTION OF EMBODIMENTS

The present disclosure provides an array substrate, a manufacturing method thereof, and a display device. In order to make purposes, technical solutions, and effects of the present disclosure clearer, the present disclosure will be further described in detail below with reference to the accompanying drawings and embodiments. It should be understood that specific embodiments described herein are merely used to explain the present disclosure and are not intended to limit the present disclosure.

As shown in FIG. 1, the present disclosure provides an array substrate 100 including a substrate 101, at least one first thin film transistor 110, and at least one second thin film transistor 120.

The first thin film transistor 110 is an oxide thin film transistor, and the second thin film transistor 120 is a low temperature polysilicon (LTPS) thin film transistor.

The substrate 101 has a laminated structure, materials of two adjacent layers are different, and the materials include molybdenum or aluminum.

The first thin film transistor 110 and the second thin film transistor 120 are disposed in parallel on the substrate 101. The first thin film transistor 110 is used as a switching thin film transistor, and the second thin film transistor 120 is used as a driving thin film transistor.

The first thin film transistor 110 includes a first gate electrode 1101, a gate insulating layer 102, an active layer 1102, a first drain electrode 1103, a first source electrode 1104, a first etching barrier block 1105, and a second etching barrier block 1106.

The first gate electrode 1101 is disposed on the substrate 101. A thickness of the first gate electrode 1101 ranges from 2000 angstroms to 5500 angstroms. The first gate electrode 1101 is prepared by a physical vapor deposition (PVD) process.

The gate insulating layer 102 is disposed on the first gate electrode 1101 and the substrate 101. The gate insulating layer 102 is deposited by a plasma enhanced chemical vapor deposition process with a deposition thickness ranging from 1500 angstroms to 4000 angstroms. The gate insulating layer 102 is a composite layer, and materials of the gate insulating layer 102 include SiNx or SiOx.

The active layer 1102 is disposed on the gate insulating layer 102.

The first drain electrode 1103 is disposed on the gate insulating layer 102, and the first drain electrode 1103 and the active layer 1102 are prepared in a same layer. Compared with a manufacturing method in the prior art, one manufacturing process is omitted, thereby reducing the manufacturing processes. Referring to FIG. 1, the first drain electrode 1103 is connected to and is in contact with a side surface 11021 of the active layer 1102.

Materials of the first drain electrode 1103 and materials of the active layer 1102 include indium gallium zinc oxide, and the first drain electrode 1103 has a characteristic of electric conductivity. A thickness of the first drain electrode 1103 and a thickness of the active layer 1102 range from 300 angstroms to 700 angstroms.

The first etching barrier block 1105 is disposed on the gate insulating layer 102, and the first etching barrier block 1105 is disposed between the second thin film transistor 120 and the first drain electrode 1103.

The first etching barrier block 1105 is deposited and prepared by a plasma enhanced chemical vapor deposition process. The first etching barrier block 1105 is a composite layer, and materials thereof include silicon nitride or silicon oxide.

The first source electrode 1104 is disposed on the active layer 1102. A thickness of the first source electrode 1104 ranges from 2000 angstroms to 5500 angstroms. The first source electrode 1104 has a laminated structure, materials of adjacent layers are different, and the materials include molybdenum or aluminum.

The array substrate 100 provided by the present disclosure defines the second thin film transistor 120 and the first thin film transistor 110 through the first etching barrier block 1105, so that an arrangement can be tight and spaces can be saved.

However, in the prior art, the second thin film transistor 120 and the first thin film transistor 110 are generally defined by coating an entire surface with the insulating layer, which may waste materials.

The first thin film transistor 110 further includes a second etching barrier block 1106.

The second etching barrier block 1106 is disposed between the active layer 1102 and the first source electrode 1104, and the active layer 1102 is adjacent to the first drain electrode 1103.

Therefore, the second etching barrier block 1106 is defined as an effective channel between the first source electrode 1104 and the first drain electrode 1103. The first source electrode 1104 is disposed on the active layer 1102, and the first drain electrode 1103 is disposed at one end of the active layer 1102, thereby shortening a distance of the channel, so that a mobility of transistors and the number of pixels of a panel can be greatly improved. An effective channel of the prior art is generally defined by a source electrode and a drain electrode disposed at both ends of the active layer 1102, so a distance of the channel may be affected by a distance between the source electrode and the drain electrode.

Figure 12:
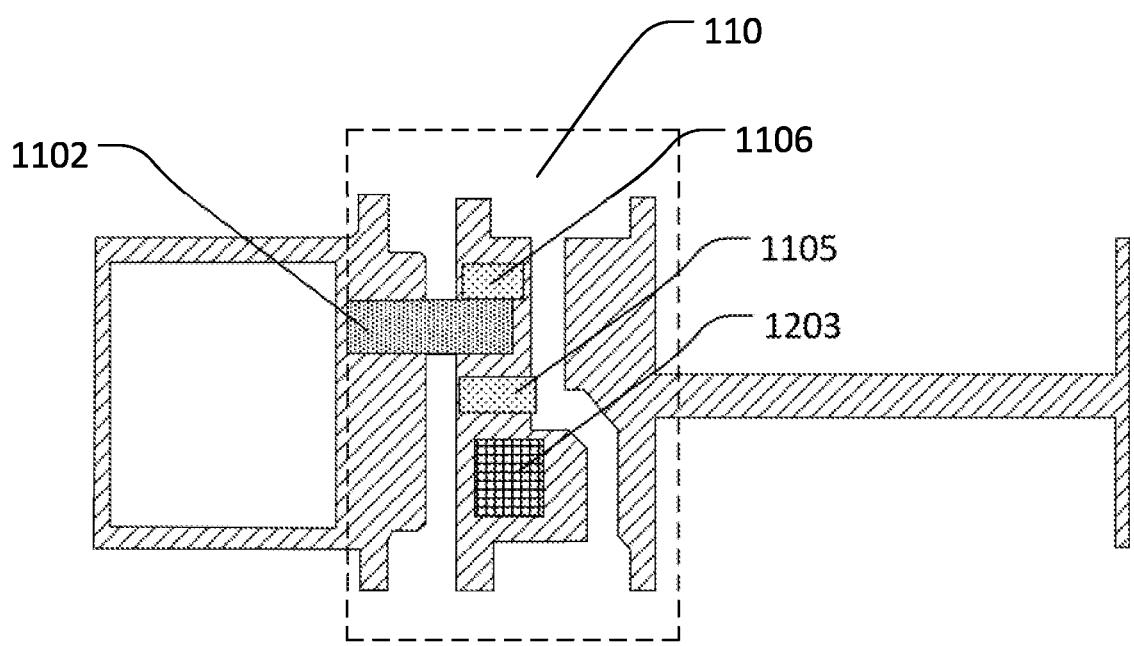
FIG. 12 is a plan view of a pattern of the polysilicon layer provided by the present disclosure.

Because the first source electrode 1104 is deposited on an entire surface and rises and falls on the second etching barrier block 1106, the first source electrode 1104 has a dam structure. Referring to FIGS. 1 and 12, the second etching barrier block 1106 covers a portion of the active layer 1102, a portion of the second etching barrier block 1106 is covered by the first source electrode 1104, and the first source electrode 1104 forms a stepped structure 11041 at the second etching barrier block 1106.

In the first thin film transistor 110 provided by the present disclosure, a short and effective channel of the first thin film transistor 110 is defined by the second etching barrier block 1106, and the mobility of transistors and the number of pixels of the panel can be greatly improved.

The second etching barrier block 1106 and the first etching barrier block 1105 are prepared in a same layer.

The second thin film transistor 120 includes a second gate electrode 1201, a polysilicon layer 1203, a second source electrode 1202, and a second drain electrode 1204.

The second gate electrode 1201 is disposed on the substrate 101 and coated by the gate insulating layer 102, and the second gate electrode 1201 and the first gate electrode 1101 are prepared in a same layer.

A thickness of the second gate electrode 1201 ranges from 2000 angstroms to 5500 angstroms. The second gate electrode 1201 is prepared by a physical vapor deposition (PVD) process.

The polysilicon layer 1203 is disposed on the gate insulating layer 102. A thickness of the polysilicon layer 1203 ranges from 400 angstroms to 1000 angstroms, and the polysilicon layer 1203 is made by PVD process.

Figure 14:
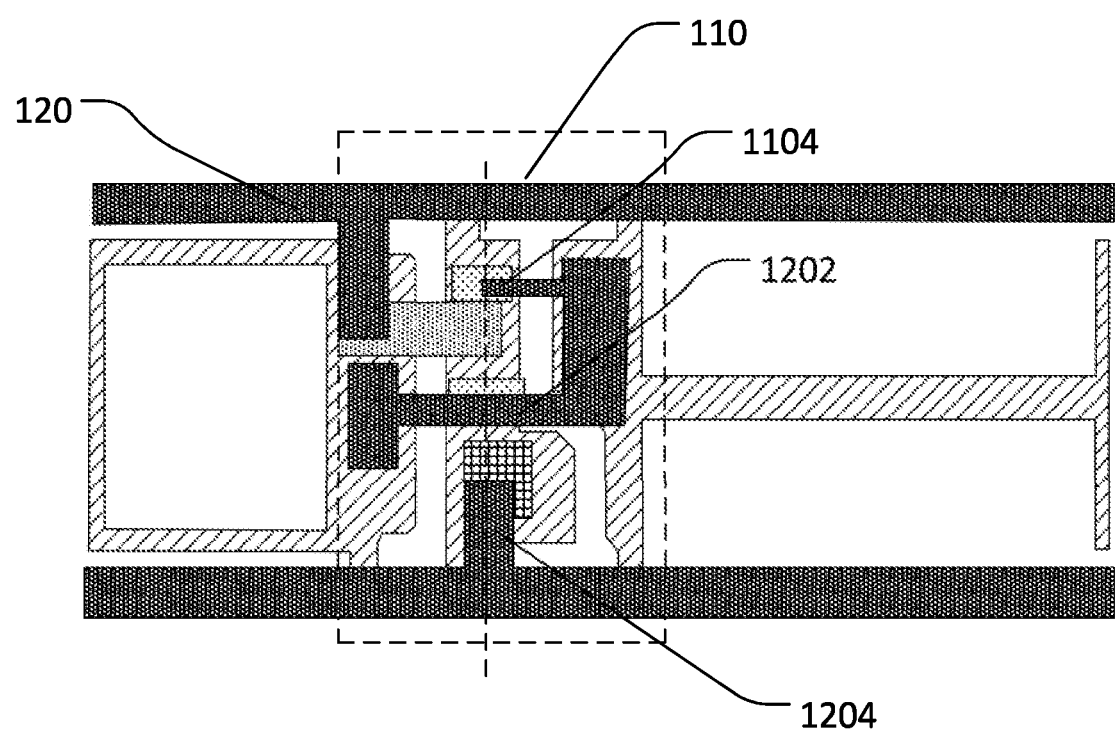
FIG. 14 is a plan view of a pattern of a second metal layer provided by the present disclosure.

The second source electrode 1202 is disposed on the first etching barrier block 1105 and the polysilicon layer 1203. A thickness of the second source electrode ranges from 2000 angstroms to 5500 angstroms. The second source electrode has a laminated structure, adjacent film layers have different materials, and the materials include molybdenum or aluminum. Referring to FIGS. 1 and 14, a portion of the second source electrode 1202 covers a portion of the first etching barrier block 1105.

The second drain electrode 1204 is disposed on the polysilicon layer 1203. A thickness of the second drain electrode ranges from 2000 angstroms to 5500 angstroms. The second drain electrode has a laminated structure, adjacent film layers have different materials, and the materials include molybdenum or aluminum.

The second source electrode 1202, the second drain electrode 1204, and the first source electrode 1104 are prepared in a same layer, and the first drain electrode 1103 and the active layer 1102 are prepared in a same layer, which do not introduce new process steps.

An opening 1121 is defined in the gate insulating layer 102, the opening 1121 extends downwards to a surface of the second gate electrode 1201, and the active layer 1102 is connected to the second gate electrode 1201 through the opening.

The array substrate 100 further includes a passivation layer 103 and a first electrode 104.

The passivation layer 103 is disposed on the first thin film transistor 110 and the second thin film transistor 120. The first electrode 104 is disposed on the passivation layer 103 and connected to the second thin film transistor 120.

Specifically, the first electrode 104 is connected to the second drain electrode 1204 of the second thin film transistor 120 through a groove 1031, the groove 1031 is defined in the passivation layer 103, and the groove 1031 extends downwards to a surface of the second drain electrode 1204.

The array substrate 100 is provided by the present disclosure. The first thin film transistor 110 and the second thin film transistor 120 are defined by the first etching barrier block 1105. The second etching barrier block 1106 is disposed between the active layer 1102 and the first source electrode 1104, and the first drain electrode 1103 is close to the active layer 1102, thereby shortening a short and effective channel (referring to the distance between the source electrode and the drain electrode) of the first thin film transistor, so that the mobility of transistors and the number of pixels of the panel can be greatly improved.

Figure 2:
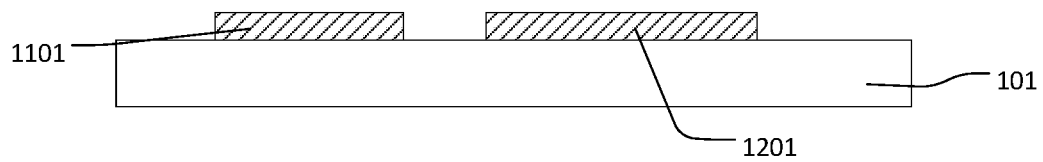
FIG. 2 is a schematic view of a part of structures in steps S1 and S2 of a manufacturing method of the array substrate provided by the present disclosure.

A manufacturing method of an array substrate is provided by the present disclosure to prepare the array substrate, including following steps:

S1, as shown in FIG. 2, providing a substrate 101, wherein the substrate 101 has a laminated structure, materials of two adjacent layers are different, and the materials include molybdenum or aluminum.

Figure 3:
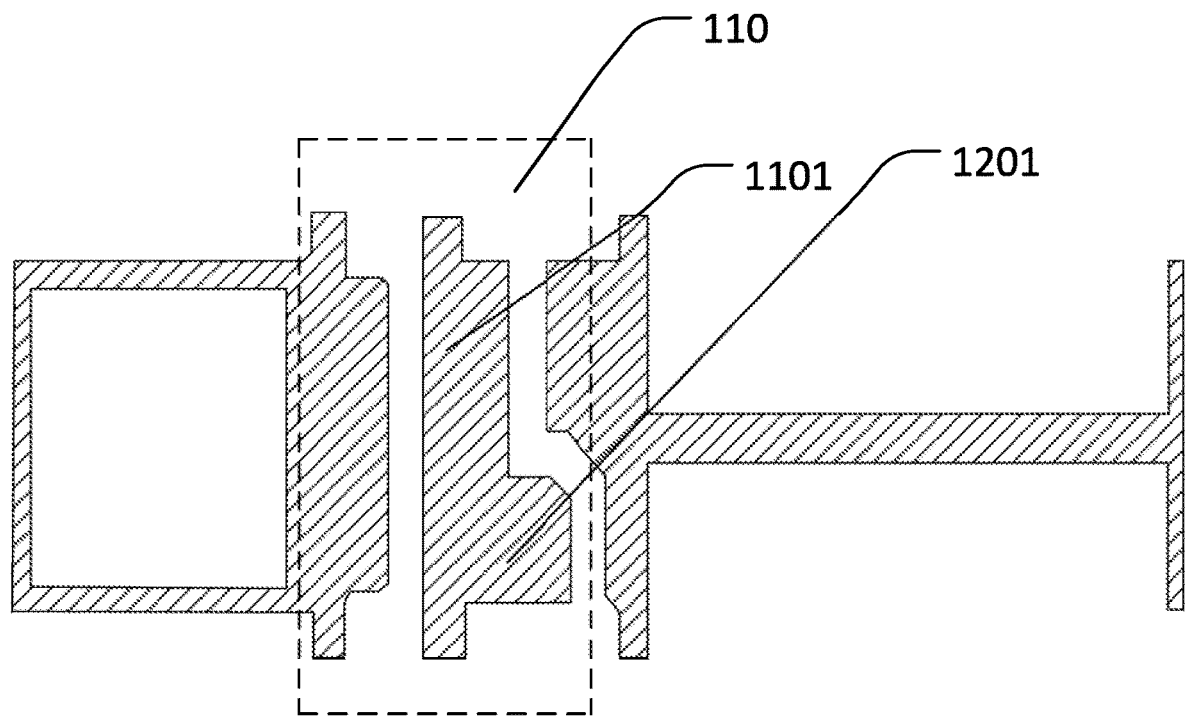
FIG. 3 is a plan view of a pattern of a first metal layer provided by the present disclosure.

S2, referring to FIG. 3 at the same time, forming a first gate electrode 1101 and a second gate electrode 1201 on the substrate 101.

Specifically, metal materials are deposited by PVD process with a thickness ranging from 2000 angstroms to 5500 angstroms, and then the metal materials are patterned by a photolithography process and an etching process to obtain the first gate electrode 1101 and the second gate electrode 1201.

A region 110 in FIG. 3 refers to a thin film transistor region of the present disclosure and shows a whole pattern of a pixel structure, sub-pixel regions are located on left and right sides of the thin film transistor region. FIG. 3 shows a pattern of a first metal layer (M1) in the pixel structure.

Figure 4:
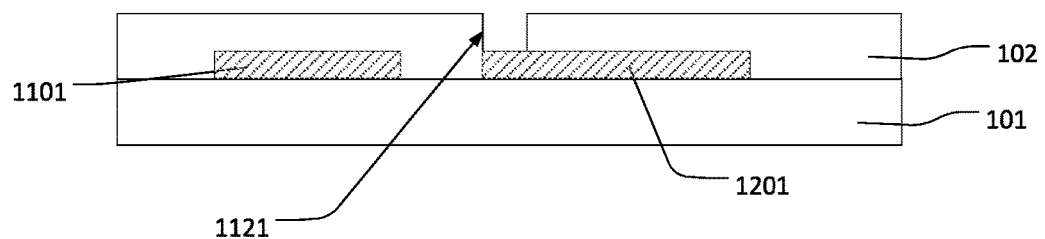
FIG. 4 is a schematic view of a part of structures in step S3 of the manufacturing method of the array substrate provided by the present disclosure.
Figure 5:
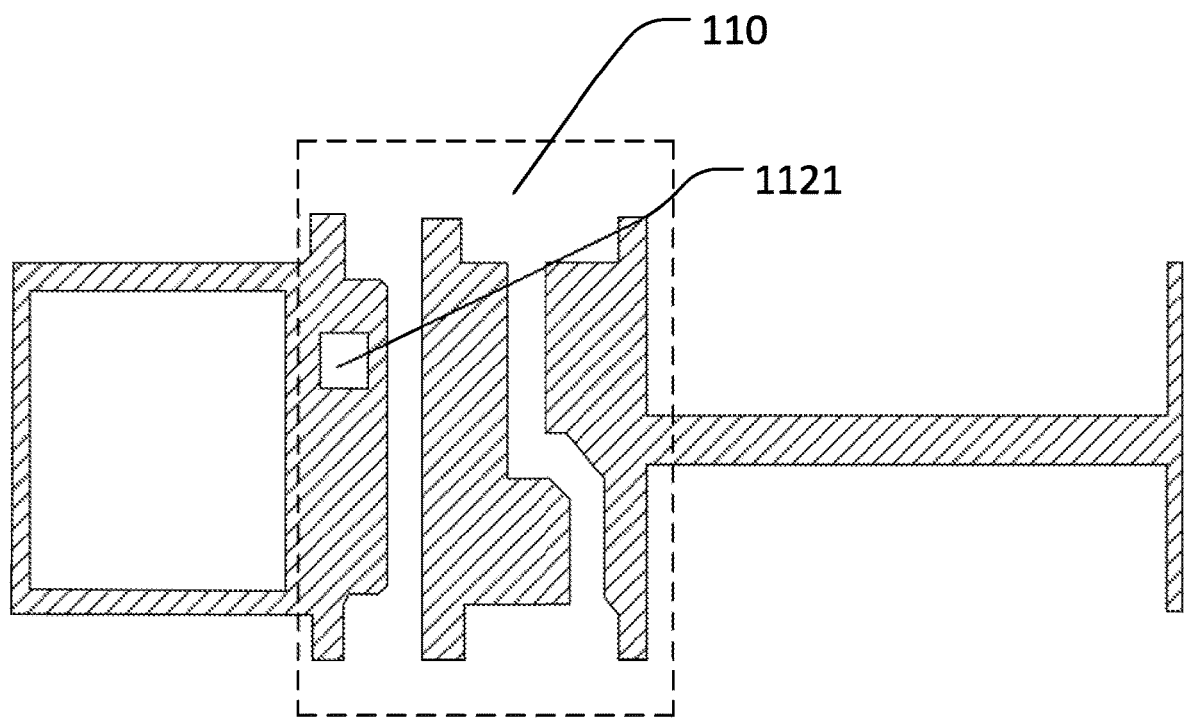
FIG. 5 is a plan view of an opening of a gate insulating layer provided by the present disclosure.

S3, as shown in FIG. 4 and FIG. 5, forming a gate insulating layer 102 on the first gate electrode 1101, the second gate electrode 1201, and the substrate 101.

Specifically, silicon nitride materials or silicon oxide materials are deposited by a plasma enhanced chemical vapor deposition process, and the silicon nitride materials or the silicon oxide materials are patterned by a photolithography process and an etching process to obtain the gate insulating layer 102. An opening 1121 is defined in the gate insulating layer 102, and the opening 1121 is recessed down to an upper surface of the second gate electrode 1201.

A thickness of the second gate electrode 1201 ranges from 1000 angstroms to 2500 angstroms.

S4, forming an active layer 1102, a first drain electrode 1103, and a polysilicon layer 1203 on the gate insulating layer 102.

A step of forming the active layer 1102, the first drain electrode 1103, and the polysilicon layer 1203 on the gate insulating layer 102 specifically includes S401 to S404.

Figure 6:
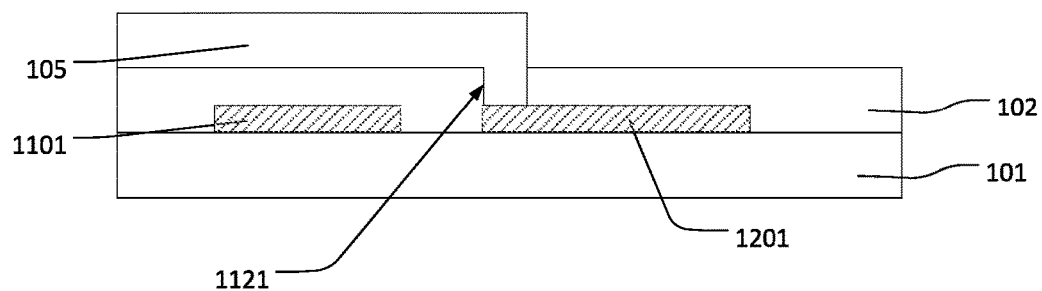
FIG. 6 is a schematic view of a part of structures in step S4 of the manufacturing method of the array substrate provided by the present disclosure.

S401, as shown in FIG. 6, forming a semiconductor layer 105 on the gate insulating layer 102, wherein the semiconductor layer 105 is connected to the second gate electrode 1201 through the opening 1121.

Figure 7:
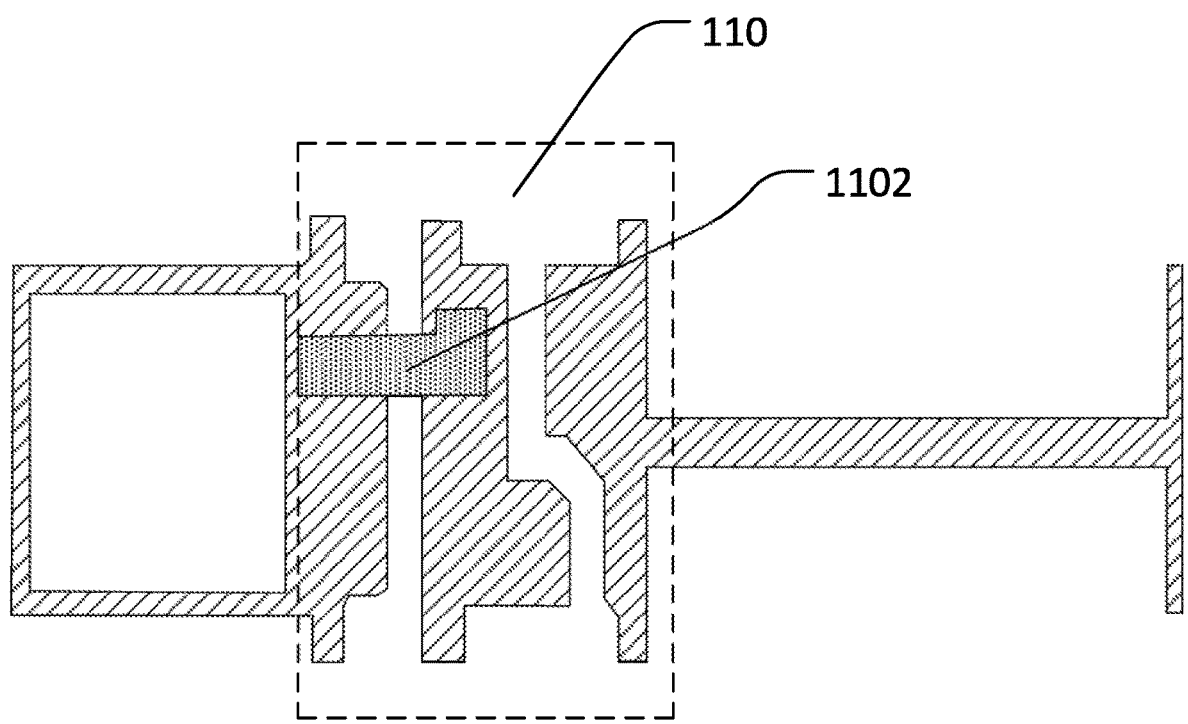
FIG. 7 is a plan view of a pattern of an active layer provided by the present disclosure.

Specifically, indium gallium zinc oxide (IGZO) materials are deposited with a thickness ranging from 300 angstroms to 700 angstroms, and the IGZO materials are patterned by a photolithography process and an etching process to obtain the semiconductor layer 105, wherein a pattern of the IGZO materials is shown in FIG. 7.

Figure 8:
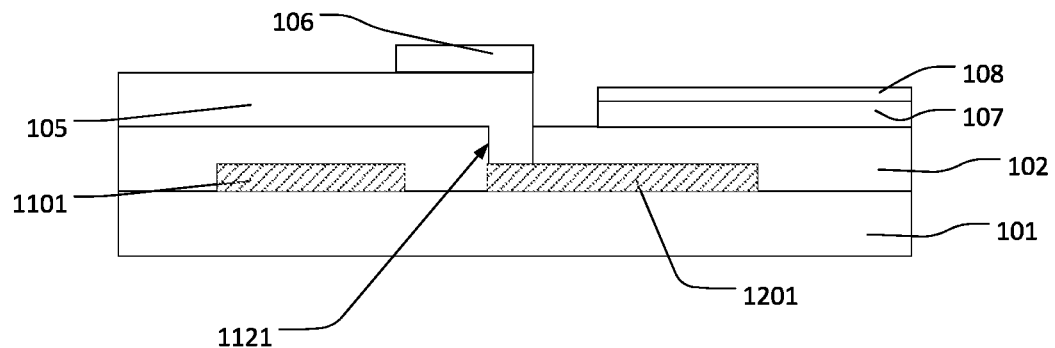
FIG. 8 is a schematic view of a part of structures in step S4 of the manufacturing method of the array substrate provided by the present disclosure.

S402, referring to FIG. 8, after forming a first single crystalline silicon layer 106 on the semiconductor layer 105, forming the active layer 1102 and the first drain electrode 1103 by the semiconductor layer 105, forming a second single crystalline silicon layer 107 on the gate insulating layer 102, and forming an inducing layer 108 on the second single crystalline silicon layer 107.

Because hydrogen ions can pass through the first single crystalline silicon layer 106 on the semiconductor layer 105, a corresponding part of the semiconductor layer 105 may be conductive, and the corresponding part refers to the first drain electrode 1103.

Specifically, an amorphous silicon (a-Si) layer is deposited by a plasma enhanced chemical vapor deposition process with a thickness ranging from 400 angstroms to 1000 angstroms, then an inducing layer of a Ni—Si alloy is deposited by a PVD process with a thickness ranging from 50 angstroms to 200 angstroms, lastly the inducing layer is patterned by a photolithography process and an etching process to obtain the first single crystalline silicon layer 106, the second single crystalline silicon layer 107, and the inducing layer 108.

S403, processing the active layer 1102 and the second single crystalline silicon layer 107 by a high temperature annealing process so as to form the polysilicon layer 1203 by the second single crystalline silicon layer 107.

Specifically, the active layer 1102 is repaired and the a-Si is crystallized to form the polysilicon layer 1203 by high temperature annealing process, wherein an annealing temperature ranges from 300° C. to 600° C., and an annealing time ranges from 0.5 hour to 4 hours.

Figure 9:
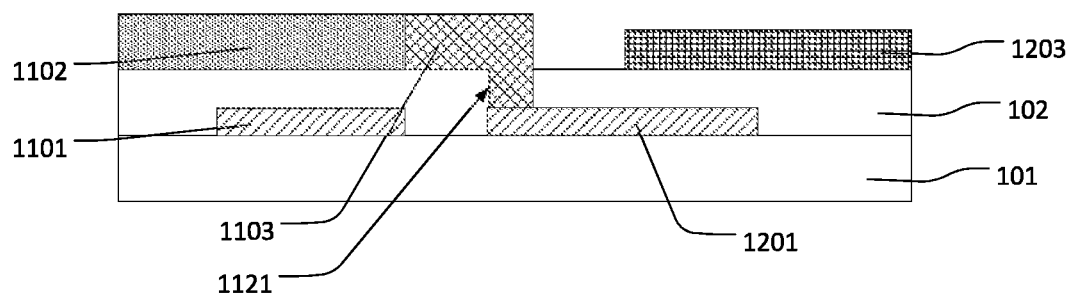
FIG. 9 is a schematic view of a part of structures in step S4 of the manufacturing method of the array substrate provided by the present disclosure.
Figure 10:
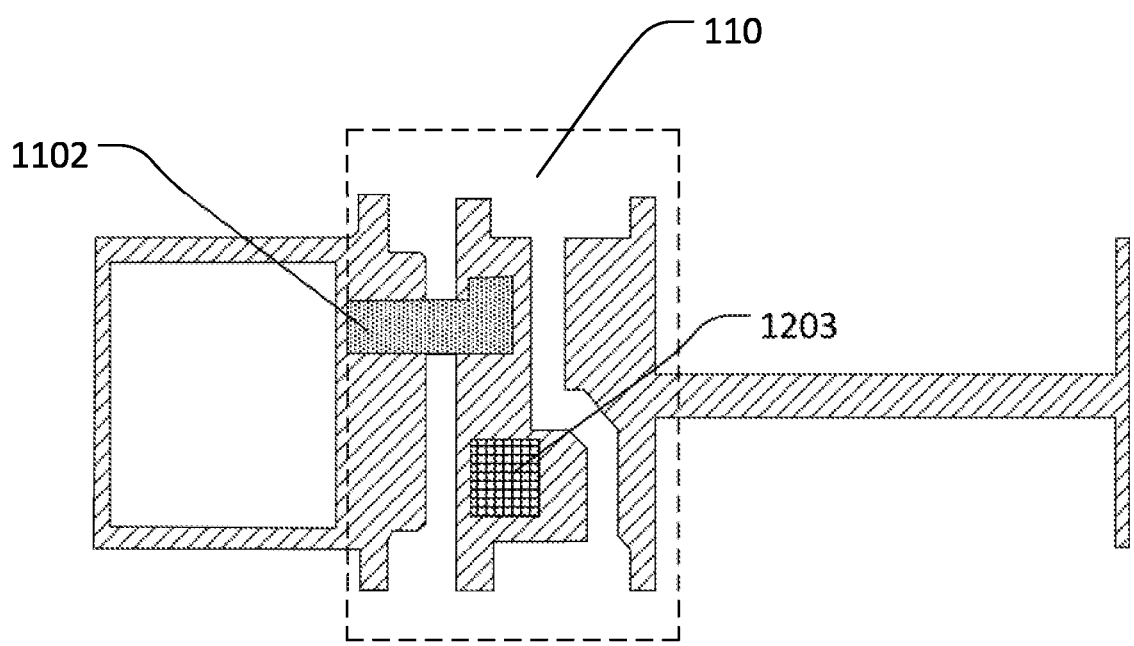
FIG. 10 is a plan view of a pattern of a polysilicon layer provided by the present disclosure.

S404, removing the inducing layer 108 and the first single crystalline silicon layer 106, and obtaining a structure as shown in FIG. 9. FIG. 10 shows a plan pattern of the structure.

Figure 11:
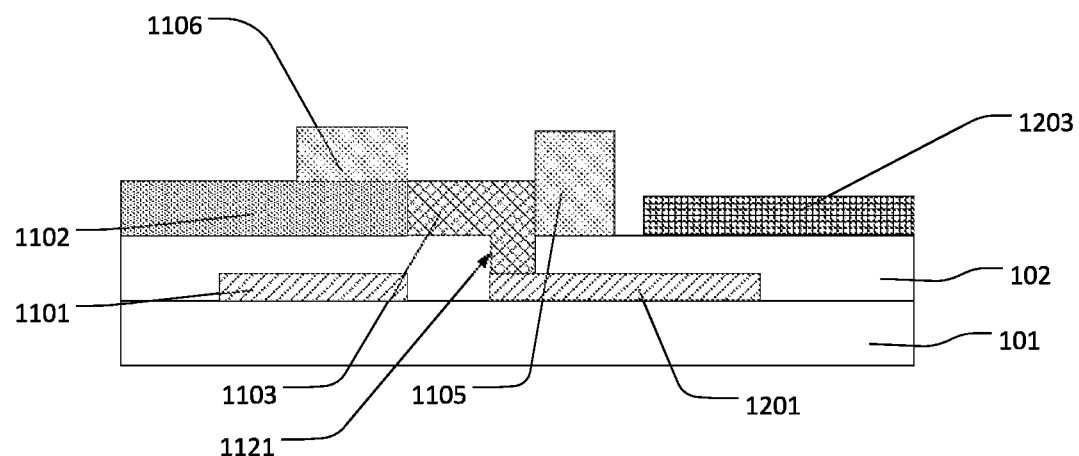
FIG. 11 is a schematic view of a part of structures in step S5 of the manufacturing method of the array substrate provided by the present disclosure.

S5, as shown in FIG. 11 and FIG. 12, forming a first etching barrier block 1105 on the gate insulating layer 102 and forming a second etching barrier block 1106 on the active layer 1102, wherein the first etching barrier block 1105 is disposed between the polysilicon layer 1203 and the first drain electrode 1103.

Specifically, silicon oxide materials and silicon nitride materials are deposited by a plasma enhanced chemical vapor deposition process with a thickness ranging from 100 angstroms to 2000 angstroms, and then the first etching barrier block 1105 and the second etching barrier block 1106 are sequentially obtained by a photolithography process and an etching process.

FIG. 12 shows a pattern of the first etching barrier block 1105 and the second etching barrier block 1106.

Figure 13:
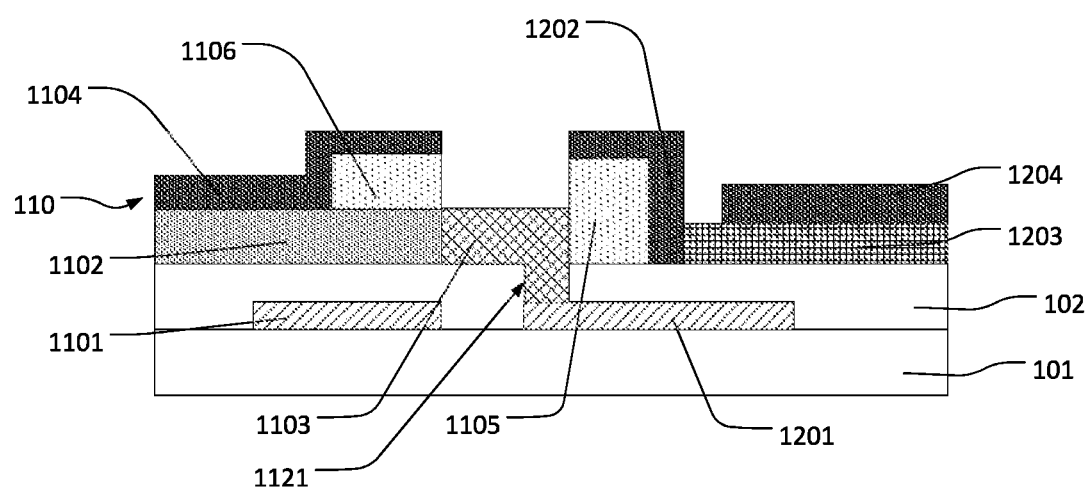
FIG. 13 is a schematic view of a part of structures in step S6 of the manufacturing method of the array substrate provided by the present disclosure.

S6, as shown in FIG. 13 and FIG. 14, forming a first source electrode 1104 on the active layer 1102, forming a second source electrode 1202 on the first etching barrier block 1105 and the polysilicon layer 1203, and forming a second drain electrode 1204 on the polysilicon layer 1203.

Specifically, metal materials are deposited by a PVD process with a thickness ranging from 2000 angstroms to 5500 angstroms, and then the metal materials are patterned by a photolithography process and an etching process to obtain the first source electrode 1104, the second source electrode 1202, and the second drain electrode 1204.

FIG. 14 shows a pattern of a second metal layer (M2), wherein upper and lower horizontal lines are data lines, and a cross-sectional structure at a vertical dashed line is shown in FIG. 1.

Figure 15:
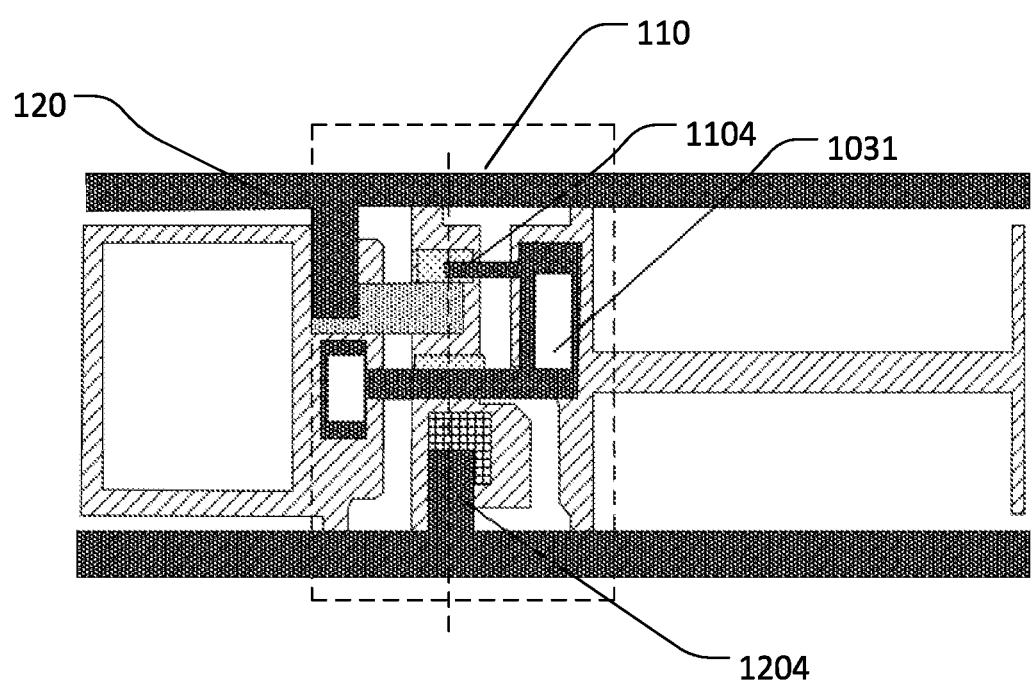
FIG. 15 is a plan view of an opening of a passivation layer provided by the present disclosure.
Figure 16:
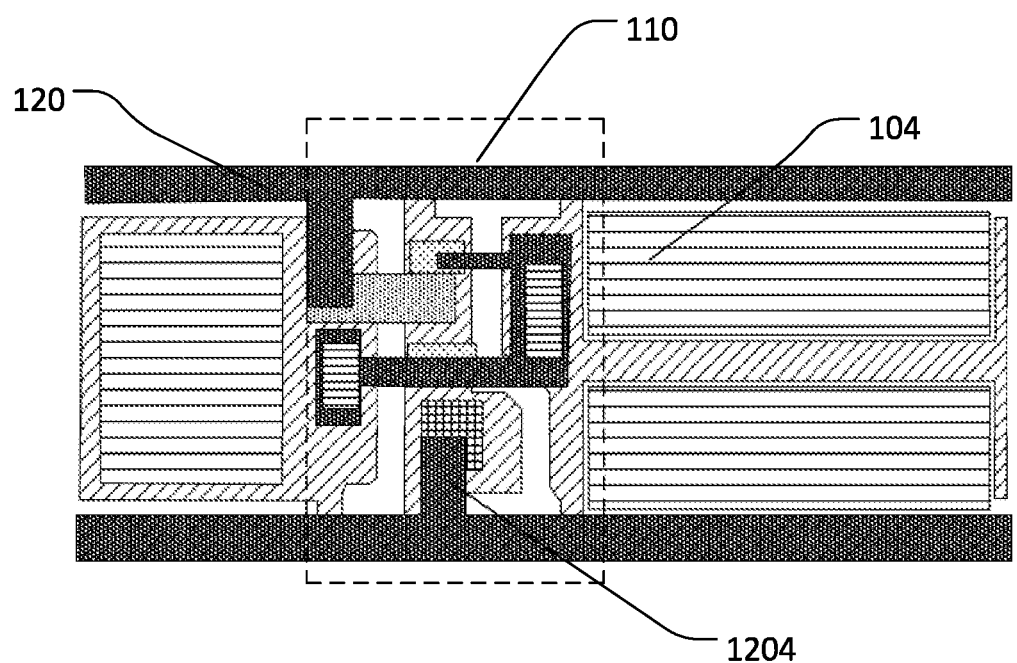
FIG. 16 is a plan view of a pattern of a first electrode provided by the present disclosure.

Lastly, an opening needs to be defined in a passivation layer as shown in FIG. 15 and a first electrode 104 needs to be coated to form the pixel structure of the present disclosure. A plurality of pixel structures are arranged in an array to form the display panel of the present disclosure.

An array substrate and a manufacturing method thereof are provided by the present disclosure. While preparing the active layer 1102, the first drain electrode 1103 is prepared together, and two thin film transistors are defined by the first etching barrier block 1105, and the first source electrode 1104 is disposed on the second etching barrier block 1106, thereby shortening a channel of the first thin film transistor 110 defined by the second etching barrier block 1106, so that a mobility and the number of pixels of the panel can be improved.

The present disclosure further provides a display device including the array substrate of the present disclosure.

It can be understood that, for those skilled in the art, equivalent replacements and modifications can be made according to the technical solution and disclosure ideas thereof of the present disclosure, and all these modifications or replacements are considered within the protection scope of the attached claims of the present disclosure.

What is claimed is:

1. An array substrate, comprising:
  a substrate; and
  at least one first thin film transistor and at least one second thin film transistor disposed in parallel on the substrate, wherein the first thin film transistor is an oxide thin film transistor, and the second thin film transistor is a low temperature polysilicon (LTPS) thin film transistor; and
  wherein the first thin film transistor comprises:
  a first gate electrode disposed on the substrate;
  a gate insulating layer disposed on the first gate electrode and the substrate;
  an active layer disposed on the gate insulating layer;
  a first drain electrode disposed on the gate insulating layer, wherein the first drain electrode and the active layer are disposed in a same layer;
  a first etching barrier block disposed on the gate insulating layer, wherein the first etching barrier block is located between the second thin film transistor and the first drain electrode; and
  a first source electrode disposed on the active layer;
  wherein the first drain electrode is connected to and is in contact with a side surface of the active layer, and materials of the first drain electrode and materials of the active layer are indium gallium zinc oxides.

2. The array substrate in claim 1, comprising:
a passivation layer disposed on the first thin film transistor and the second thin film transistor; and
a first electrode disposed on the passivation layer and connected to the second thin film transistor.

3. The array substrate in claim 1, wherein the first thin film transistor comprises a second etching barrier block disposed between the active layer and the first source electrode.

4. The array substrate in claim 3, wherein the second etching barrier block and the first etching barrier block are disposed in a same layer.

5. The array substrate in claim 3, wherein the second etching barrier block covers a portion of the active layer, a portion of the second etching barrier block is covered by the first source electrode, and the first source electrode forms a stepped structure at the second etching barrier block.

6. The array substrate in claim 1, wherein the second thin film transistor comprises:
a second gate electrode disposed on the substrate and coated by the gate insulating layer, wherein the second gate electrode and the first gate electrode are disposed in a same layer;
a polysilicon layer disposed on the gate insulating layer;
a second source electrode disposed on the first etching barrier block and the polysilicon layer; and
a second drain electrode disposed on the polysilicon layer.

7. The array substrate in claim 6, wherein the second source electrode, the second drain electrode, and the first source electrode are disposed in a same layer.

8. The array substrate in claim 6, wherein an opening is defined in the gate insulating layer and extends downwards to a surface of the second gate electrode, and the active layer is connected to the second gate electrode through the opening.

9. The array substrate in claim 6, wherein a portion of the second source electrode covers a portion of the first etching barrier block.

10. A manufacturing method of an array substrate, comprising:
providing a substrate;
forming a first gate electrode and a second gate electrode on the substrate;
forming a gate insulating layer on the first gate electrode, the second gate electrode, and the substrate;
forming an active layer, a first drain electrode, and a polysilicon layer on the gate insulating layer;
forming a first etching barrier block on the gate insulating layer and forming a second etching barrier block on the active layer, wherein the first etching barrier block is disposed between the polysilicon layer and the first drain electrode; and
forming a first source electrode on the active layer, forming a second source electrode on the first etching barrier block and the polysilicon layer, and forming a second drain electrode on the polysilicon layer;
wherein the first drain electrode is connected to and is in contact with a side surface of the active layer, and materials of the first drain electrode and materials of the active layer are indium gallium zinc oxides.

11. The manufacturing method of the array substrate in claim 10, wherein the step of forming the active layer, the first drain electrode, and the polysilicon layer on the gate insulating layer specifically comprises:

forming a semiconductor layer on the gate insulating layer;
after forming a first single crystalline silicon layer on the semiconductor layer, forming the active layer and the first drain electrode by the semiconductor layer, forming a second single crystalline silicon layer on the gate insulating layer, and forming an inducing layer on the second single crystalline silicon layer;
processing the active layer and the second single crystalline silicon layer by a high temperature annealing process, so as to form the polysilicon layer by the second single crystalline silicon layer; and
removing the inducing layer and the first single crystalline silicon layer.

12. A display device, comprising an array substrate, the array substrate comprising:
a substrate; and
at least one first thin film transistor and at least one second thin film transistor disposed in parallel on the substrate, wherein the first thin film transistor is an oxide thin film transistor, and the second thin film transistor is a low temperature polysilicon (LTPS) thin film transistor; and
wherein the first thin film transistor comprises:
a first gate electrode disposed on the substrate;
a gate insulating layer disposed on the first gate electrode and the substrate;
an active layer disposed on the gate insulating layer;
a first drain electrode disposed on the gate insulating layer, wherein the first drain electrode and the active layer are disposed in a same layer;
a first etching barrier block disposed on the gate insulating layer, wherein the first etching barrier block is located between the second thin film transistor and the first drain electrode; and
a first source electrode disposed on the active layer;
wherein the first drain electrode is connected to and is in contact with a side surface of the active layer, and materials of the first drain electrode and materials of the active layer are indium gallium zinc oxides.

13. The display device in claim 12, wherein the array substrate comprises:
a passivation layer disposed on the first thin film transistor and the second thin film transistor; and
a first electrode disposed on the passivation layer and connected to the second thin film transistor.

14. The display device in claim 12, wherein the first thin film transistor comprises a second etching barrier block disposed between the active layer and the first source electrode.

15. The display device in claim 14, wherein the second etching barrier block and the first etching barrier block are disposed in a same layer.

16. The display device in claim 12, wherein the second thin film transistor comprises:
a second gate electrode disposed on the substrate and coated by the gate insulating layer, wherein the second gate electrode and the first gate electrode are disposed in a same layer;
a polysilicon layer disposed on the gate insulating layer;
a second source electrode disposed on the first etching barrier block and the polysilicon layer; and
a second drain electrode disposed on the polysilicon layer.

17. The display device in claim 16, wherein the second source electrode, the second drain electrode and the first source electrode are disposed in a same layer.

18. The display device in claim 16, wherein an opening is defined in the gate insulating layer and extends downwards to a surface of the second gate electrode, and the active layer is connected to the second gate electrode through the opening.

* * * * *